(12) United States Patent
Cai et al.

(10) Patent No.: US 11,856,810 B2
(45) Date of Patent: Dec. 26, 2023

(54) DISPLAY PANEL

(71) Applicant: BOE Technology Group Co., Ltd., Beijing (CN)

(72) Inventors: Peng Cai, Beijing (CN); Youwei Wang, Beijing (CN); Yongxiang Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 182 days.

(21) Appl. No.: 17/048,316

(22) PCT Filed: Mar. 25, 2020

(86) PCT No.: PCT/CN2020/081252
§ 371 (c)(1),
(2) Date: Oct. 16, 2020

(87) PCT Pub. No.: WO2020/200016
PCT Pub. Date: Oct. 8, 2020

(65) Prior Publication Data
US 2021/0167327 A1    Jun. 3, 2021

(30) Foreign Application Priority Data

Mar. 29, 2019 (CN) .......................... 201910250820.9

(51) Int. Cl.
*H10K 50/844* (2023.01)
*H10K 71/00* (2023.01)
(Continued)

(52) U.S. Cl.
CPC ........... *H10K 50/844* (2023.02); *H10K 71/00* (2023.02); *H10K 77/10* (2023.02); *H10K 50/81* (2023.02);
(Continued)

(58) Field of Classification Search
CPC ... H01L 51/5253–5256; H01L 51/0096; H01L 51/56; H01L 51/5206; H01L 27/3246; H01L 27/3258; H01L 2227/323
See application file for complete search history.

(56) References Cited

U.S. PATENT DOCUMENTS

2014/0131683 A1*  5/2014  Kim ................... H01L 51/5253
                                                                    438/22
2017/0162822 A1    6/2017  Park et al.
(Continued)

FOREIGN PATENT DOCUMENTS

CN    103811530 A    5/2014
CN    107180923 A    9/2017
(Continued)

OTHER PUBLICATIONS

CN201910250820.9 OA1.

*Primary Examiner* — Shaun M Campbell
(74) *Attorney, Agent, or Firm* — IPro, PLLC

(57) ABSTRACT

The disclosure relates to the field of display technology, and discloses a display panel. The display panel includes: a substrate including a display area; a backplane film layer, on a side of the substrate and in the display area; a via hole, in the display area and running through the backplane film layer; and a protective barrier, in the via hole and covering the end side of the backplane film layer.

12 Claims, 13 Drawing Sheets

(51) Int. Cl.
  *H10K 77/10* (2023.01)
  *H10K 50/81* (2023.01)
  *H10K 59/122* (2023.01)
  *H10K 59/124* (2023.01)
  *H10K 59/12* (2023.01)
(52) U.S. Cl.
  CPC ....... *H10K 59/1201* (2023.02); *H10K 59/122* (2023.02); *H10K 59/124* (2023.02)

(56) References Cited

U.S. PATENT DOCUMENTS

| | | | |
|---|---|---|---|
| 2017/0288004 A1* | 10/2017 | Kim | H01L 27/3258 |
| 2018/0299603 A1 | 10/2018 | Lee et al. | |
| 2020/0006704 A1 | 1/2020 | Zhang et al. | |
| 2020/0013834 A1* | 1/2020 | Park | H01L 27/3246 |
| 2020/0212147 A1* | 7/2020 | Han | H01L 25/18 |
| 2020/0287157 A1* | 9/2020 | Seong | H10K 59/12 |
| 2022/0020957 A1* | 1/2022 | Choi | H01L 27/3234 |

FOREIGN PATENT DOCUMENTS

| | | |
|---|---|---|
| CN | 108598287 A | 9/2018 |
| CN | 108666352 A | 10/2018 |
| CN | 108766996 A | 11/2018 |
| CN | 109273494 A | 1/2019 |
| CN | 109461839 A | 3/2019 |
| CN | 109950426 A | 6/2019 |

* cited by examiner

DISPLAY PANEL

CROSS REFERENCE TO RELATED APPLICATIONS

The disclosure is a US National Stage of International Application No. PCT/CN2020/081252, filed on Mar. 25, 2020, which claims the priority of Chinese patent application No. 201910250820.9, filed with China National Intellectual Property Administration on Mar. 29, 2019, and entitled "Preparation Method of Flexible Display Panel", the contents of which are incorporated by reference herein in its entirety.

FIELD

The disclosure relates to the field of display technology, in particular to a display panel.

BACKGROUND

A flexible display panel is a display device based on a flexible substrate. Owing to such features as flexibility, wide viewing angle and portability, the flexible display device has a broad application prospect and a good market potential in portable products and most display application fields.

SUMMARY

The disclosure provides a display panel. The display panel includes: a substrate, including a display area; a backplane film layer, on a side of the substrate and in the display area; a via hole, in the display area and running through the backplane film layer; and a protective barrier, in the via hole and covering an end side of the backplane film layer.

In some embodiments, an orthographic projection of the protective barrier on the substrate is a closed ring.

In some embodiments, the display panel further includes a protective film layer. Where the protective film layer is located between the side of the backplane film layer and the protective barrier.

In some embodiments, the backplane film layer includes a buffer layer, an active layer, a gate insulating layer, a gate layer, an interlayer insulating layer, a source/drain layer, a passivation layer, a planarization layer, an anode layer and a pixel defining layer arranged on the substrate in sequence. Where the buffer layer, the gate insulating layer, the interlayer insulating layer and the passivation layer are all inorganic film layers.

In some embodiments, the protective barrier includes at least one layer of film layer structure, and the at least one layer of film layer structure is selected from at least one of the active layer, the gate layer, the source/drain layer, the planarization layer, the anode layer and the pixel defining layer.

In some embodiments, the protective barrier is a single-layer film structure, and the material of the single-layer film is metal or organic material.

In some embodiments, the material of the protective film layer is metal.

In some embodiments, the display panel includes a film layer of the light-emitting device disposed on a side, facing away from the substrate, of the backplane film layer; and the film layer of the light-emitting device is provided with a hollow area at the position of the via hole.

In some embodiments, the display panel further includes an encapsulation layer arranged on a side, facing away from the substrate, of the film layer of the light-emitting device. Where the encapsulation layer includes: a first inorganic encapsulation layer, an organic encapsulation layer and a second inorganic encapsulation layer arranged far away from the substrate in sequence. The second inorganic encapsulation layer is provided with an inclined part which extends towards the backplane film layer on a side facing towards the via hole, and the section of the inclined part is step-like and covers in sequence a side wall of the organic encapsulation layer, a side wall of the first inorganic encapsulation layer and part of the backplane film layer.

In some embodiments, the display panel further includes: an encapsulating protective barrier on a side, facing from the substrate, of the protective barrier. The encapsulating protective barrier covers the inclined part and is in contact with the inclined part.

In some embodiments, an orthographic projection of the encapsulating protective barrier on the substrate is a closed ring, and surrounds the orthographic projection of the protective barrier on the substrate.

In some embodiments, the encapsulating protective barrier includes an acrylic-based resin or a fluoride.

The embodiments of the disclosure further provide another display panel. The display panel includes: a substrate, including a display area; a to-be-punched area in the display area; a reserved area, area in the display area other than the to-be-punched area being the reserved area; a backplane film layer in the reserved area; and a cutting damage prevention structure in the to-be-punched area and including a to-be-cut structure and a protective barrier enclosing the to-be-cut structure.

In some embodiments, the to-be-cut structure and the protective barrier are an integral structure before punching.

In some embodiments, the orthographic projection of the cutting damage prevention structure on the substrate is a circle, an oval, a rectangle, a triangle or a trapezoid.

In some embodiments, an orthographic projection of the cutting damage prevention structure on the substrate is a closed ring.

In some embodiments, the display panel includes an organic light-emitting layer, a cathode layer, a first inorganic encapsulation layer, an organic encapsulation layer and a second inorganic encapsulation layer in sequence on a side, facing away from the substrate, of the backplane film layer, where the organic light-emitting layer, the cathode layer, the first inorganic encapsulation layer, the organic encapsulation layer and the second inorganic encapsulation layer are all provided with a hollow area in the to-be-punched area. The second inorganic encapsulation layer is provided with an inclined part which extends towards the backplane film layer on a side facing towards the via hole, and the section of the inclined part is step-like and covers in sequence a side wall of the organic encapsulation layer, a side wall of the first inorganic encapsulation layer and part of the backplane film layer; and an annular encapsulating blocking structure is further provided on a side, facing away from the substrate, of the cutting damage prevention structure, and a gap is formed between the encapsulating blocking structure and the inclined part.

In some embodiments, the display panel further includes: an encapsulating protection structure filled in the gap.

In some embodiments, the encapsulating protection structure includes an annular groove on a side of the encapsulating protection structure facing away from the backplane film layer. The depth of the annular groove extends towards the encapsulating blocking structure, and the annular groove exposes part of the encapsulating blocking structure.

In some embodiments, the encapsulating protection structure includes a circular notch on a side of the encapsulating protection structure facing away from the backplane film layer. The depth of the circular notch extends towards the encapsulating blocking structure, and the circular notch exposes part of the encapsulating blocking structure.

DETAILED DESCRIPTION OF THE EMBODIMENTS

A clear and complete description will be given below on the technical solutions in the embodiments of the disclosure referring to the accompanying drawings in the embodiments of the disclosure. Apparently, the embodiments described below are only a part but not all of the embodiments of the disclosure. Based upon the embodiments here of the disclosure, all the other embodiments which can occur to those skilled in the art without any inventive effort shall fall into the protection scope of the disclosure.

In related art, during a display area being cut and drilled through a flexible display device, since cracks is produced in the area corresponding to cutting, and the cracks may extend towards the flexible display area, cracks is likely produced in an inorganic film in the flexible display array substrate. As such, the performance of the flexible display device is lowered, and the flexible display cannot be normally used.

Figure 1:
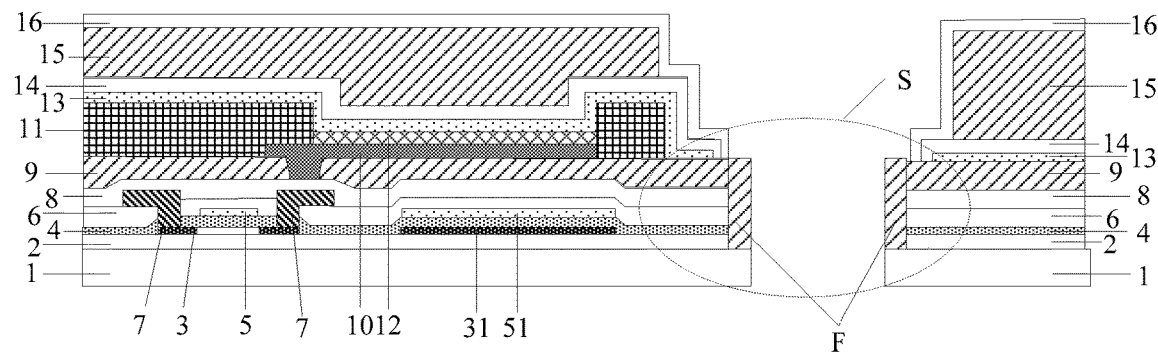
FIG. 1 is a structural schematic diagram of a sectional view of a display panel with the protective barrier and the backplane film layer being arranged on the same layer provided in an embodiment of the disclosure.
Figure 2:
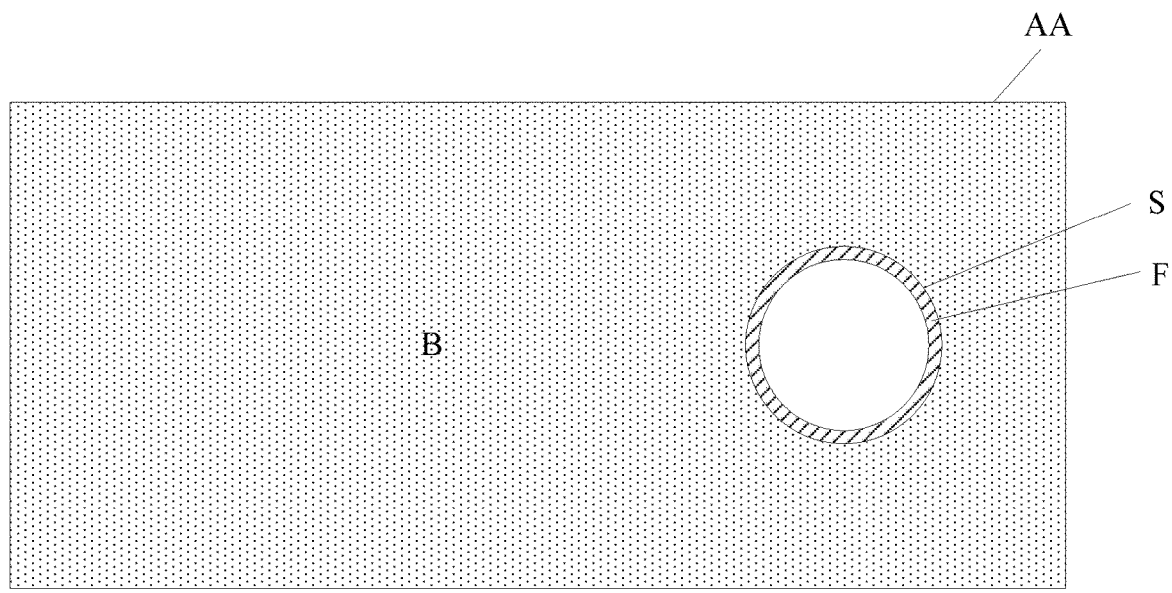
FIG. 2 is a structural schematic diagram of a top view of a display panel with the protective barrier and the backplane film layer being arranged on the same layer provided in an embodiment of the disclosure.

As shown in FIG. 1 and FIG. 2, the embodiment of the disclosure provides a display panel, including:

a substrate 1, including a display area AA;

a backplane film layer, on a side of the substrate 1 and in the display area AA;

a via hole S, in the display area AA and running through the backplane film layer; and a protective barrier F, inside the via hole S and covering the end side of the backplane film layer. In some embodiments, the material of the protective barrier F can be different from the material of the function film layer.

In some embodiments of the disclosure, the via hole S in the display area is provided with a protective barrier F at an inner side wall. In the manufacturing process, a cutting damage prevention structure which is independent of the backplane film layer and integral with the protective barrier F can be firstly formed in the to-be-punched area (the area at which the via hole S is located before punching). In the process of punching, the cutting path of punching is located at the position at which the cutting damage prevention structure is arranged, since the materials of the cutting damage prevention structure and the protective barrier F are different from the material of the function film layer, and the cutting damage prevention structure and the protective barrier F are not integral with the function film layer, the problem of cracks produced in the cutting process extending to the display area except the via hole due to the film layer structure of the to-be-punched area being completely consistent with the film layer structure of the reserved area B other than the to-be-punched area, which will lead to the display panel being easily eroded by external moisture, low performance and even that the display panel cannot be normally used, can be avoided.

During specific implementation, referring to FIG. 2, the orthographic projection of the protective barrier F on the substrate 1 is a closed ring.

During specific implementation, referring to FIG. 1, the via hole S in the embodiments of the disclosure can be a through hole running through the whole display panel along the thickness direction. The via hole can be configured to enable the display device to be placed with a camera or a sensor and other parts in the subsequent manufacturing process.

Based on the existing experience in the related art, in the punching process, cracks is easily produced in an inorganic film layer in the function film layers. As such, the material of the protective barrier F in the embodiments of the disclosure can be different from the material of the inorganic film layer in the function film layer. For example, organic materials and metal materials in which cracks are not easily produced can be selected.

During specific implementation, the protective barrier F in the embodiments of the disclosure can be a structure configured to protect different film layers in the display panel, for example, can be a protective barrier F configured to protect the backplane film layer in the display panel from cracks, and a brief description will be given below through examples.

For example, the protective barrier F protects the backplane film layer in the display panel from cracks, referring to FIG. 1, the protective barrier F is in the layer in which the backplane film layers is located. In some embodiments of the disclosure, the protective barrier F and the backplane film layers are disposed in the same layer, can protect the backplane film layer from cracks in the punching process, and further enable the backplane film layer to have a favorable film layer quality.

It should be noted that, the backplane film layers in the embodiment of the disclosure can be a composite film layer including multiple film layers. In some embodiments, the display panel can include a buffer layer 2, an active layer 3, a gate insulating layer 4, a gate layer 5, an interlayer insulating layer 6, a source/drain layer 7, a passivation layer 8, a planarization layer 9, an anode layer 10, a pixel defining layer 11, an organic light-emitting layer 12, a cathode layer 13, a first inorganic encapsulation layer 14, an organic encapsulation layer 15 and a second inorganic encapsulation layer 16 arranged on the substrate 1 in sequence. Accordingly, the backplane film layer can include: a buffer layer 2, an active layer 3, a gate insulating layer 4, a gate layer 5, an interlayer insulating layer 6, a source/drain layer 7, a passivation layer 8, a planarization layer 9, an anode layer 10 and a pixel defining layer 11; the light-emitting layer can include: an organic light-emitting layer 12 and a cathode layer 13; the encapsulation layer can include: a first inorganic encapsulation layer 14, an organic encapsulation layer 15 and a second inorganic encapsulation layer 16; and the light-emitting layer and the encapsulation layer can serve as a film layer of a light-emitting device.

Figure 3:
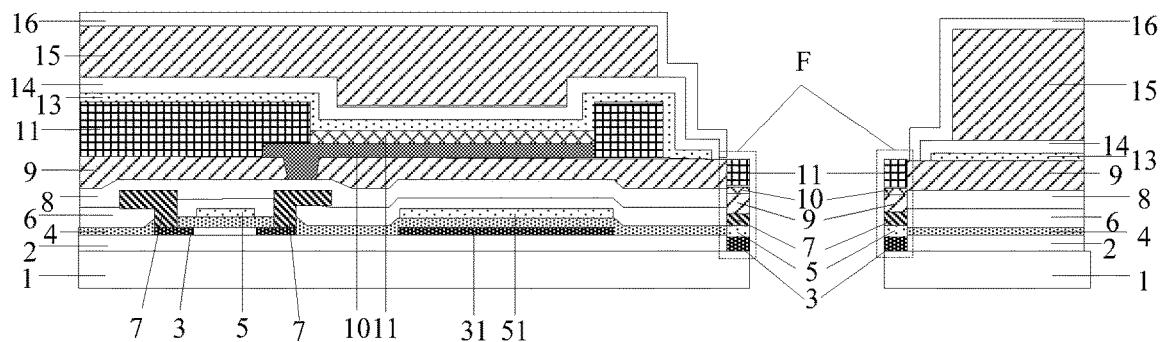
FIG. 3 is a structural schematic diagram showing that the protective barrier includes a backplane film layer provided in an embodiment of the disclosure.

In some embodiments, in a case that the protective barrier F is in the layer in which the backplane film layer is located, the protective barrier F includes at least one layer of film layer structure, the at least one layer of film layer structure is selected from at least one of an active layer 3, a gate layer 5, a source/drain layer 7, a planarization layer 9, an anode layer 10 and a pixel defining layer 11 in the backplane film layer. That is, the protective barrier F can be formed through the film layers included in the backplane film layer itself, however, inorganic film layers in which cracks is easily produced need to be removed. As shown in FIG. 3, the protective barrier F is includes film layers, except the inorganic film layer, in the backplane film layer. In some embodiments, the buffer layer 2, the gate insulating layer 4, the interlayer insulating layer 6 and the passivation layer 8 in the backplane film layer are all inorganic film layers. The protective barrier F includes part of the active layer 3, part of the gate layer 5, part of the source/drain layer 7, part of the planarization layer 9, part of the anode layer 10 and part of the pixel defining layer 11 in sequence on the substrate 1. Of course, during specific implementation, the protective barrier F can be formed by utilizing all the other film layers, except the inorganic film layer, in the backplane film layer, or can be formed by utilizing part of the film layers in other film layers, except the inorganic film layer, in the backplane film layer. For example, the protective barrier F does not includes the anode layer 10. In the embodiments of the disclosure, the protective barrier F includes other film layers, except the inorganic film layer, in the backplane film layer, and can be formed during the display panel being manufactured, and no additional process is required, thereby simplifying the manufacturing process of the display panel provided with a protective barrier.

Figure 4:
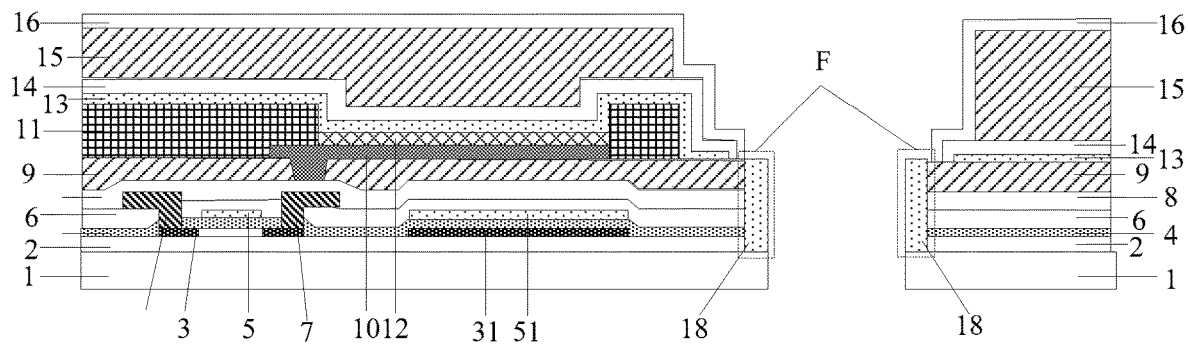
FIG. 4 is a structural schematic diagram showing that the protective barrier includes a first film provided in an embodiment of the disclosure.

In some embodiments, in the case that the protective barrier F is in the layer in which the backplane film layer is located, the protective barrier F can also be formed by film layers independent of the backplane film layer. The protective barrier F is a single-layer film structure, the material of the single-layer film is metal or organic material. As shown in FIG. 4, the protective barrier F includes a first film 18 independent of the backplane film layer. In some embodiments of the disclosure, in the case that the protective barrier F is a single-layer film structure, the material of the protective barrier F can have more options, to allow the protective barrier to have a good performance in preventing cracks.

In some embodiments, the material of the first film 18 can be metal or organic materials. In some embodiments of the disclosure, in the case that the material of the first film 18 is metal or organic material, since cracks are not easily produced in metal or organic material during the process of cutting, cracks are not easily produced in the protective barrier F, and further no extending cracks will be produced in the reserved area other than the via hole.

Figure 5:
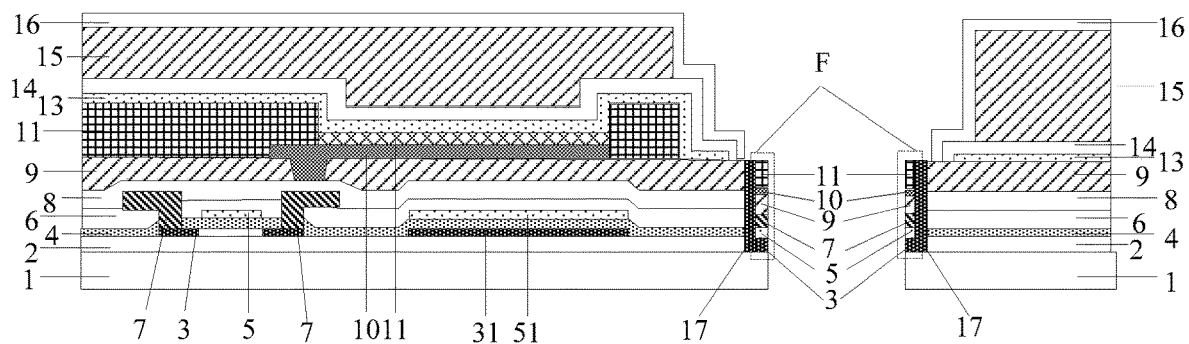
FIG. 5 is a structural schematic diagram of a display panel including a protective film layer provided in an embodiment of the disclosure.
Figure 6:
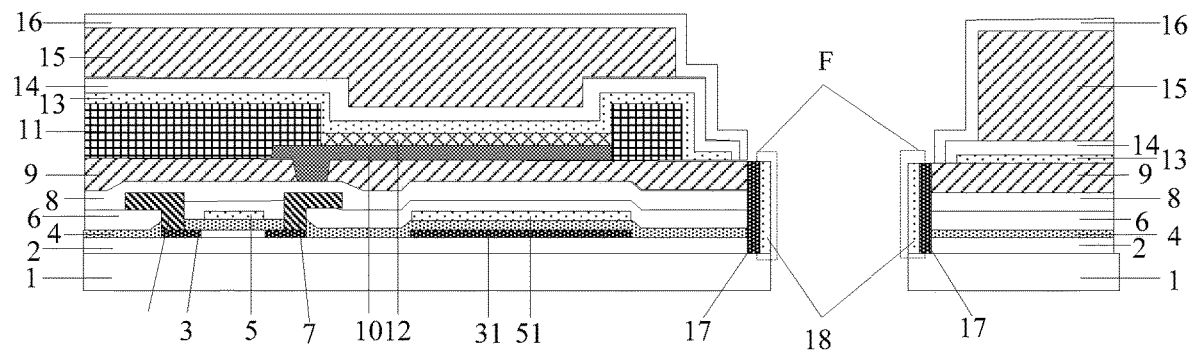
FIG. 6 is a structural schematic diagram of another display panel including the protective film layer provided in an embodiment of the disclosure.

During specific implementation, as shown in FIG. 5 and FIG. 6, the display panel further includes a protective film layer 17, between a side edge of the backplane film layer and the protective barrier F. The protective film layer 17 surrounds the inner side wall of the via hole and is located between the protective barrier F and the inner side of the via hole. The material of the protective film layer 17 can be in some embodiments metal. In some embodiments of the disclosure, the material of the protective film layer 17 is metal, the heat generated during laser cutting can be timely guided away since metal has a favorable heat-conducting property, and the side wall of the via hole can be protected since metal has a favorable capability in blocking water and oxygen, by which intrusion of external moisture into the display panel from the side wall of the via hole can be prevented.

During specific implementation, referring to FIG. 1 to FIG. 7, the film layer of the light-emitting device is provided with a hollow area corresponding to the position of the via hole S, the second inorganic encapsulation layer 16 is provided with an inclined part 19 which extends towards the backplane film layer on a side facing the via hole S, and the section of the inclined part 19 is step-like and covers in sequence a side wall of the organic encapsulation layer 15, a side wall of the first inorganic encapsulation layer 14 and part of the backplane film layer.

Figure 7:
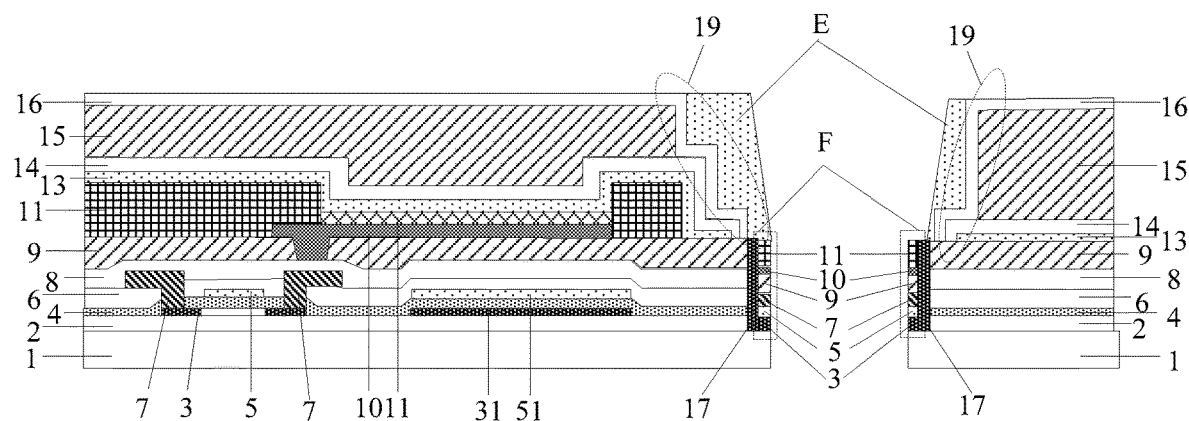
FIG. 7 is a structural schematic diagram of a sectional view of a display panel including an encapsulating protective barrier provided in an embodiment of the disclosure.

During specific implementation, referring to FIG. 7, the display panel further includes: an encapsulating protective barrier E on a side, facing away from the substrate 1, of the protective barrier F, where the encapsulating protective barrier E covers the inclined part 19 and is in contact with the inclined part 19. That is, one side, facing the inclined part 19, of the encapsulating protective barrier E is a shape complementary with the step-like inclined part 19.

In some embodiments of the disclosure, the display panel further includes: an encapsulating protective barrier E on a side, facing away from the substrate 1, of the protective barrier F, to protect the film layer of the light-emitting device from cracks in the punching process.

In some embodiments, referring to FIG. 7, the top end (that is, the upper end face) of the encapsulating protective barrier E and the surface, facing away from the organic encapsulation layer 15, of the second inorganic encapsulation layer 16 are in the same plane. The bottom end (that is, the lower end face) of the encapsulating protective barrier E and the surface (in some embodiments can be the upper surface of the planarization layer 9), facing the film layer of the light-emitting device, of the backplane film layer are in the same plane.

In some embodiments, the material of the encapsulating protective barrier E can be an acrylic-based resin or a fluoride. In some embodiments of the disclosure, the material of the encapsulating protective barrier E is an acrylic-based resin or a fluoride, the encapsulating protective barrier E can absorb the heat generated in the laser cutting process, can improve the waterproof capability of the via hole of the display panel due to a higher waterproof performance.

In some embodiments, an orthographic projection of the encapsulating protective barrier E on the substrate 1 is a closed ring, and encircles the orthographic projection of the protective barrier F on the substrate 1.

Figure 8:
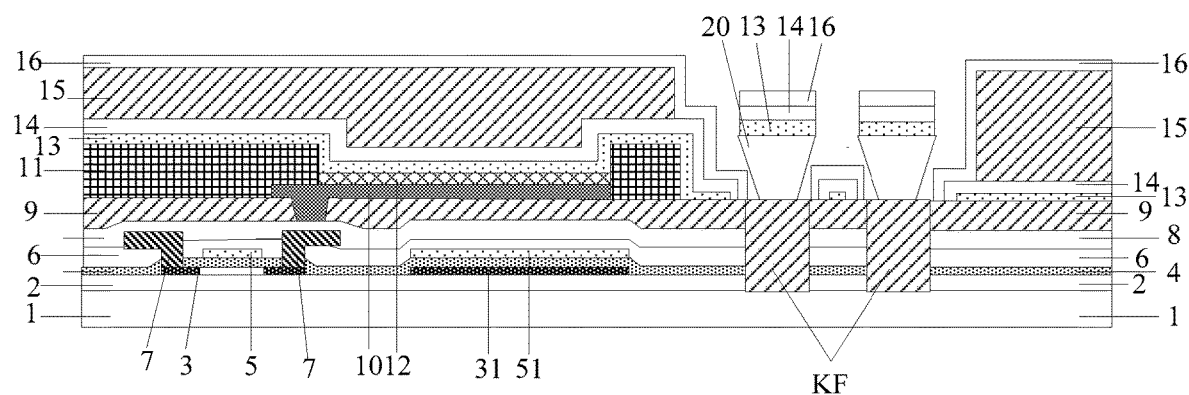
FIG. 8 is a schematic diagram of a sectional view of a display panel with the orthographic projection of the cutting damage prevention structure being hollow in the middle before punching provided in an embodiment of the disclosure.
Figure 9:
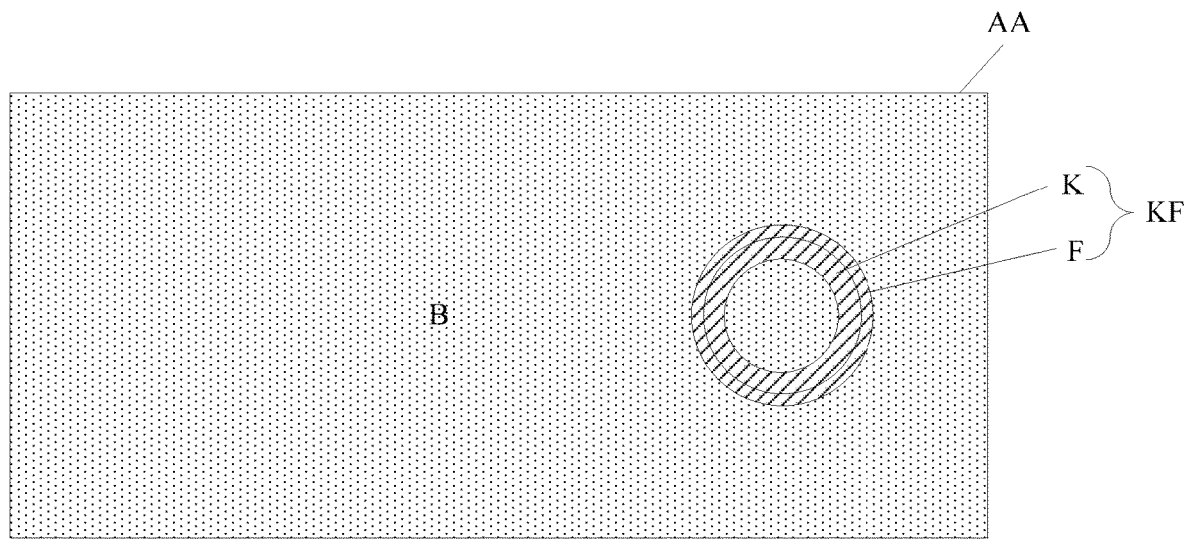
FIG. 9 is a schematic diagram of a top view of a display panel with the orthographic projection of the cutting damage prevention structure being hollow in the middle before punching provided in an embodiment of the disclosure.

It should be noted that, the above description illustrates a structure after a display panel is punched, based on the same disclosed concept, some embodiment of the disclosure further provides the structure of a display panel before punching, as shown in FIG. 8 and FIG. 9, the display panel includes:
 a substrate 1, including a display area AA;
  a to-be-punched area in the display area AA;
  a reserved area B, where the area in the display area AA other than the to-be-punched area is the reserved area B;
 a backplane film layer in the reserved area AA; and
 a cutting damage prevention structure KF in the to-be-punched area and including a to-be-cut structure K and a protective barrier F enclosing the to-be-cut structure K. The material of the protective barrier F can be different from the material in the backplane film layer, that is, before punching, the display panel includes a to-be-cut structure K and a protective barrier F (a to-be-cut structure K and a protective barrier F can be an integral structure before punching and cutting), during punching, the to-be-cut structure K is cut off, and the protective barrier F remains on the punched display panel.

In some embodiments of the disclosure, the to-be-punched area of the display panel is provided with a cutting damage prevention structure KF. In the punching process, the cutting path of punching is in the position at which the cutting damage prevention structure KF is located, since the materials of the cutting damage prevention structure KF and the protective barrier F are different from the material of the function film layer, and are not integral with the function film layer, in the cutting process, the problem of cracks produced in the cutting process extending to the display area except the via hole due to the film layer structure of the to-be-punched area being completely consistent with the film layer structure of the reserved area B other than the to-be-punched area, which will lead to the display panel being easily eroded by external moisture, low performance and even that the display panel cannot be normally used, can be avoided.

During specific implementation, referring to FIG. 8 and FIG. 9, the display panel includes a substrate 1. The orthographic projection of the cutting damage prevention structure KF on the substrate 1 is a closed pattern which is hollow in the middle. That is, the cutting damage prevention structure KF is a hollow structure, and the film layer structure of the display panel in the middle hollow position of the cutting damage prevention structure KF can be the same as the film layer structure of the reserved area B. In some embodiments, the orthographic projection of the cutting damage prevention structure KF on the substrate 1 can be annular or frame-shaped.

Figure 10:
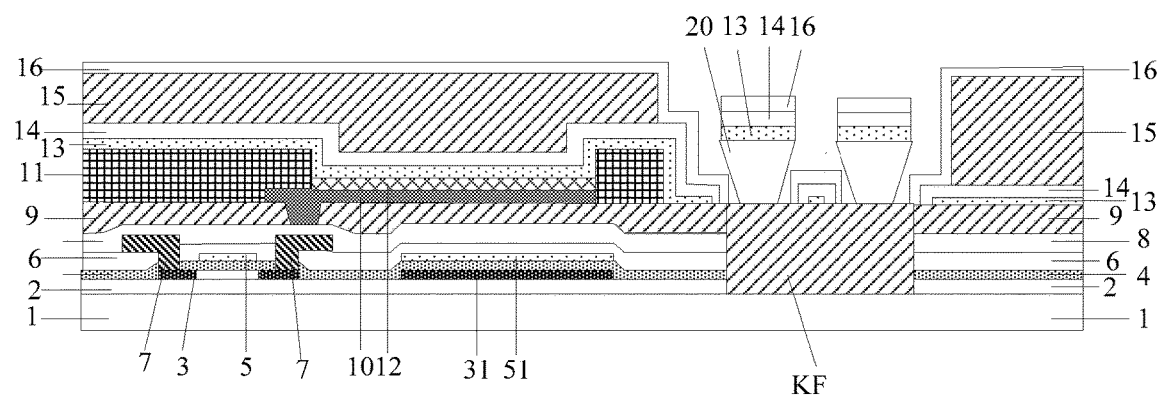
FIG. 10 is a schematic diagram of a sectional view of a display panel with the orthographic projection of the cutting damage prevention structure being a circle before punching provided in an embodiment of the disclosure.
Figure 11:
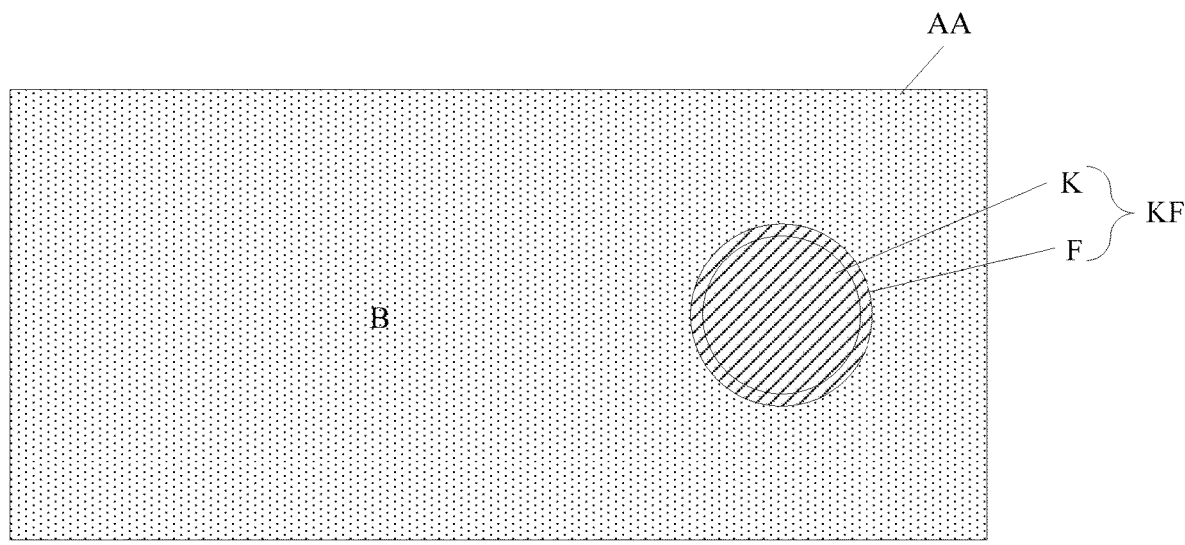
FIG. 11 is a schematic diagram of a top view of a display panel with the orthographic projection of the cutting damage prevention structure being a circle before punching provided in an embodiment of the disclosure.

During specific implementation, as shown in FIG. 10 and FIG. 11, the display panel includes a substrate 1. The orthographic projection of the cutting damage prevention structure KF on the substrate 1 is a circle, an oval, a rectangle, a triangle or a trapezoid. That is, the cutting damage prevention structure is a solid structure, and the cutting damage prevention structure KF is formed in the whole to-be-punched area.

During specific implementation, the to-be-cut structure K and the protective barrier F are an integral structure before punching. In some embodiments of the disclosure, the to-be-cut structure K and the protective barrier F are an integral structure before punching, to simplify the manufacturing of the cutting damage prevention structure KF and the protective barrier F, which is easy to realize.

During specific implementation, referring to FIG. 8 and FIG. 10, the cutting damage prevention structure KF is used for protecting the backplane film layer, the cutting damage prevention structure KF being in the layer in which the backplane film layer is located. That is, since the to-be-cut structure and the protective barrier F are an integral structure before cutting, the constitution of the two is basically the same.

In some embodiments, as shown in FIG. 8, the display panel can include a buffer layer 2, an active layer 3, a gate insulating layer 4, a gate layer 5, an interlayer insulating layer 6, a source/drain layer 7, a passivation layer 8, a planarization layer 9, an anode layer 10, a pixel defining layer 11, an organic light-emitting layer 12, a cathode layer 13, a first inorganic encapsulation layer 14, an organic encapsulation layer 15 and a second inorganic encapsulation layer 16 on the substrate 1 in sequence; the backplane film layer can include: a buffer layer 2, an active layer 3, a gate insulating layer 4, a gate layer 5, an interlayer insulating layer 6, a source/drain layer 7, a passivation layer 8, a planarization layer 9, an anode layer 10 and a pixel defining layer 11; the light-emitting layer can include: an organic light-emitting layer 12 and a cathode layer 13; the encapsulation layer can include: a first inorganic encapsulation layer 14, an organic encapsulation layer 15 and a second inorganic encapsulation layer 16; and the light-emitting layer and the encapsulation layer can serve as a film layer of a light-emitting device.

Figure 12:
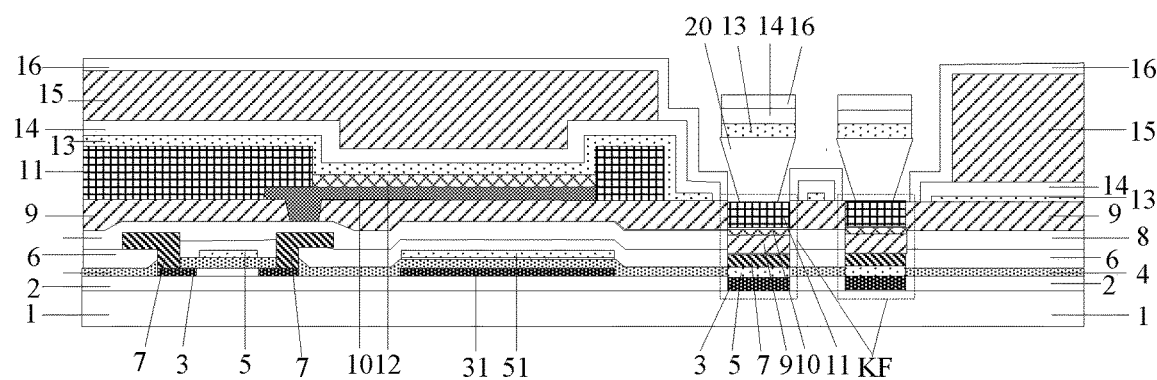
FIG. 12 is a schematic diagram of a display panel in which a cutting damage prevention structure includes a backplane film layer before punching provided in an embodiment of the disclosure.

In some embodiments, as shown in FIG. 12, the cutting damage prevention structure KF includes other film layers, except the inorganic film layer, in the backplane film layer. In some embodiments, the cutting damage prevention structure KF includes at least one layer of film layer structure, the at least one layer of film layer structure is selected from at least one of an active layer 3, a gate layer 5, a source/drain layer 7, a planarization layer 9, an anode layer 10 and a pixel defining layer 11. In some embodiments, the cutting damage prevention structure KF includes part of the active layer 3, part of the gate layer 5, part of the source/drain layer 7, part of the planarization layer 9, part of the anode layer 10 and part of the pixel defining layer 11 which are arranged in sequence on the substrate 1.

Figure 13:
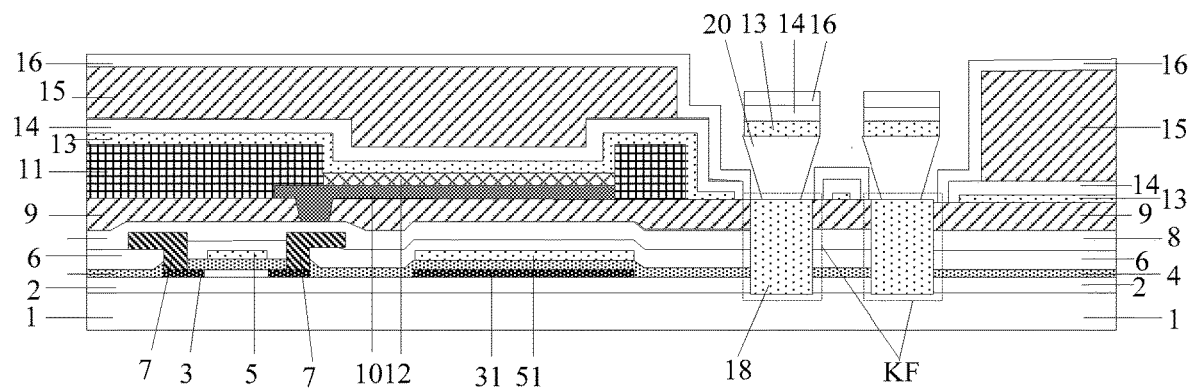
FIG. 13 is a schematic diagram of a top view of a display panel in which a cutting damage prevention structure includes a first film before punching provided in an embodiment of the disclosure.

In some embodiments, as shown in FIG. 13, the cutting damage prevention structure KF includes a single film layer which is independent of the backplane film layer. For example, the cutting damage prevention structure KF includes the first film 18. The material of the first film 18 can be metal or organic material.

Figure 14:
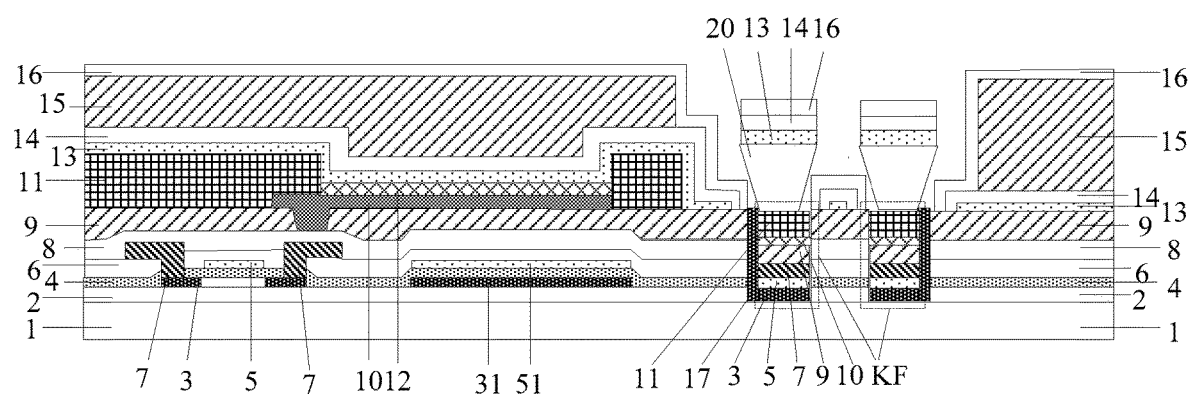
FIG. 14 is a structural schematic diagram of a display panel including a protective film layer before punching provided in an embodiment of the disclosure.
Figure 15:
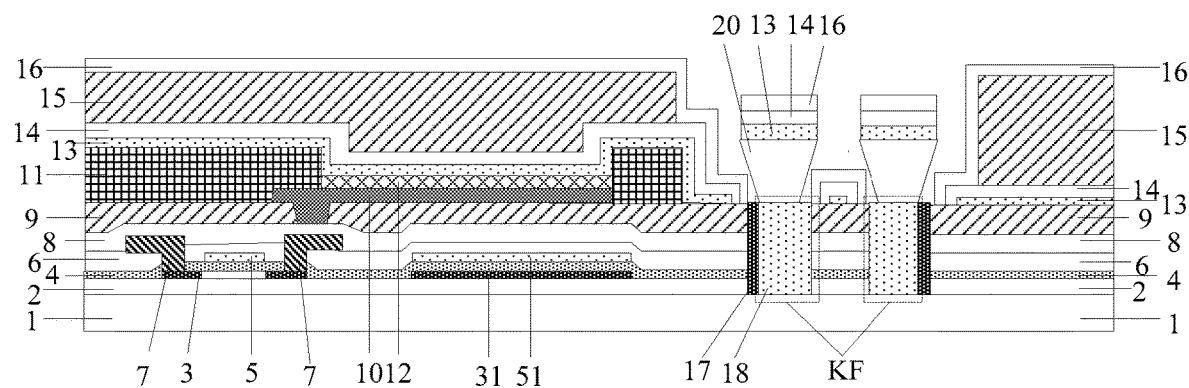
FIG. 15 is a structural schematic diagram of another display panel including a protective film layer before punching provided in an embodiment of the disclosure.

In some embodiments, as shown in FIG. 14 and FIG. 15, the outer side wall, facing towards the reserved area, of the cutting damage prevention structure KF can be further provided with a protective film layer 17, and the material of the protective film layer 17 can be metal. In a case that the display panel is further provided with a protective film layer 17 made of metal, since metal has a favorable heat-conducting property, heat generated during laser cutting can be timely guided away. Further, since metal has a favorable capability in blocking water and oxygen, the barrier can also favorably protect the side wall of the via hole of the display panel, thereby preventing intrusion of external moisture into the display panel from the side wall of the via hole.

During specific implementation, as shown in FIG. 8 to FIG. 16, the second inorganic encapsulation layer 16 is provided with an inclined part 19 which extends towards the backplane film layer on a side facing towards the via hole S, and the section of the inclined part 19 is step-like and covers in sequence a side wall of the organic encapsulation layer 15, a side wall of the first inorganic encapsulation layer 14 and part of the backplane film layer. The side, facing away from the substrate 1, of the cutting damage prevention structure KF further includes: an annular encapsulating blocking structure. A gap is formed between the encapsulating blocking structure and the inclined part 19. In some embodiments, the encapsulating blocking structure includes: a blocking layer 20, part of the cathode layer 13 on a side, facing away from the backplane film layer, of the blocking layer 20, part of the first inorganic encapsulation layer 14 and part of the second inorganic encapsulation layer 16. A gap is formed between the encapsulating blocking structure and the encapsulation layer; and the encapsulating blocking structure is filled in the gap. In some embodiments, cutting damage prevention materials can be filled in the gap through a manner of gluing and coating or ink-jet printing to form the encapsulating blocking structure.

In some embodiments of the disclosure, the display panel further includes an encapsulating blocking structure, and the encapsulating blocking structure includes a blocking layer 20. After the light-emitting layer is manufactured, when the encapsulation layer needs to be manufactured, the blocking layer 20 can be set to block the encapsulation layer. As such, the encapsulation layer of the to-be-punched area is not connected with the encapsulation layer of the reserved area, thereby avoiding a problem that cracks produced in the encapsulation layer of the to-be-punched area may extend to the reserved area in the case that the encapsulation layer is integrally connected with the reserved area in the to-be-punched area, which affects the encapsulation effect.

Figure 16:
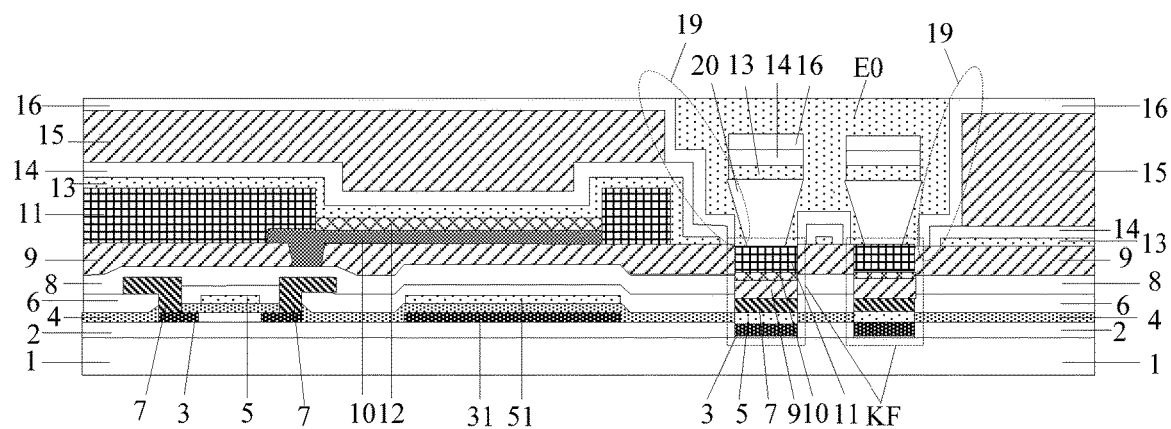
FIG. 16 is a structural schematic diagram of a display panel in which an encapsulating protection structure is filled in a gap before punching provided in an embodiment of the disclosure.

In some embodiments, referring to FIG. 16, in the direction from the film layer of the light-emitting device towards the substrate 1, width of the section of the blocking layer 20 is gradually decreased. The section of the blocking layer 20 can be in some embodiments an inverted trapezoid. In some embodiments of the disclosure, in the direction from the film layer of the light-emitting device towards the substrate, width of the section of the blocking layer 20 is gradually decreased, thereby having a favorable effect in blocking the encapsulation layer.

In some embodiments, referring to FIG. 16, the display panel further includes: an encapsulating protection structure E0. The encapsulating protection structure E0 is filled in the gap. In some embodiments, the encapsulating protection structure E0 is an encapsulating protective barrier E before punching.

Figure 17:
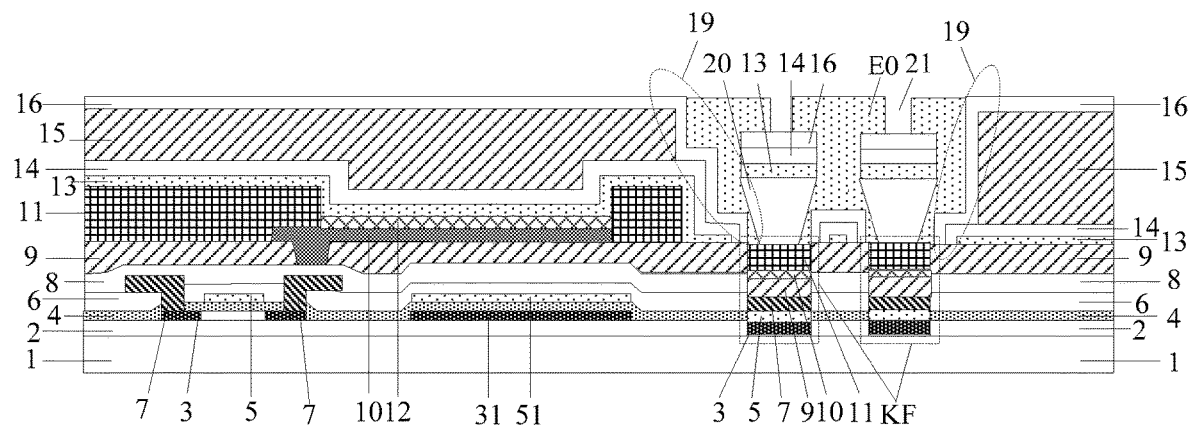
FIG. 17 is a structural schematic diagram showing that an encapsulating protection structure is provided with an annular groove before punching provided in an embodiment of the disclosure.

During specific implementation, as shown in FIG. 17, an annular groove 21 is further provided on a side, facing away from the backplane film layer, of the encapsulating protection structure E0. Depth of the annular groove extends towards the encapsulating blocking structure. The annular groove 21 exposes part of the encapsulating blocking structure. That is, the to-be-cut position of the cutting damage prevention structure is firstly thinned, to reduce the difficulty in subsequent cutting.

Figure 18:
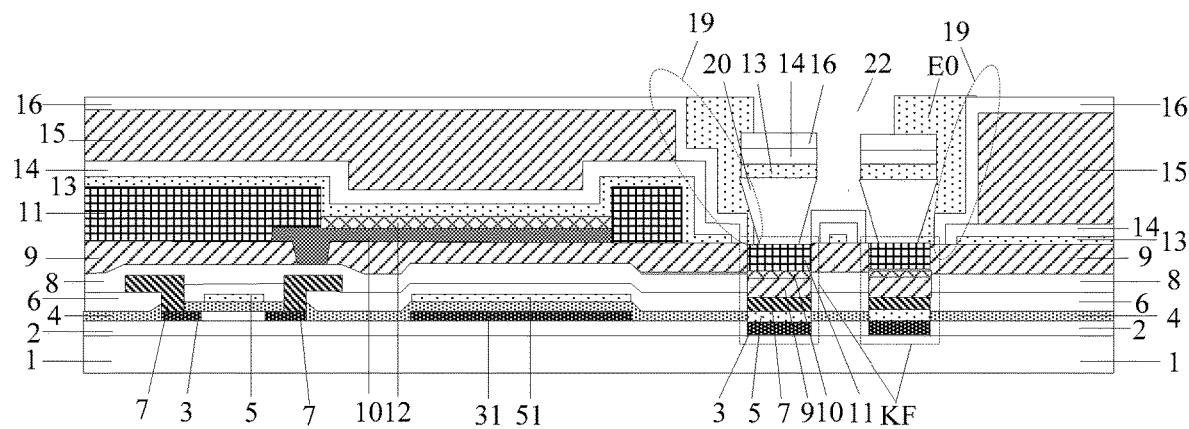
FIG. 18 is a structural schematic diagram showing that an encapsulating protection structure is provided with a circular notch before punching provided in an embodiment of the disclosure.

During specific implementation, as shown in FIG. 18, a circular notch 22 is further provided on a side, facing away from the backplane film layer, of the encapsulating protection structure E0. Depth of circular notch 22 extends towards the encapsulating blocking structure and the circular notch 22 exposes part of the encapsulating blocking structure.

Figure 19:
FIG. 19 is a structural schematic diagram of a display panel after a buffer layer is formed provided in an embodiment of the disclosure.
Figure 20:
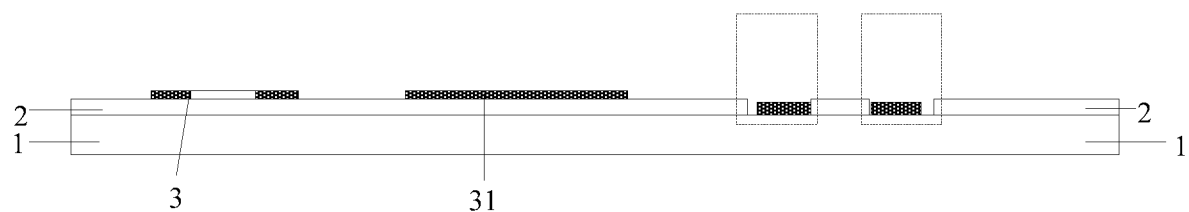
FIG. 20 is a structural schematic diagram of a display panel after an active layer is formed provided in an embodiment of the disclosure.
Figure 21:
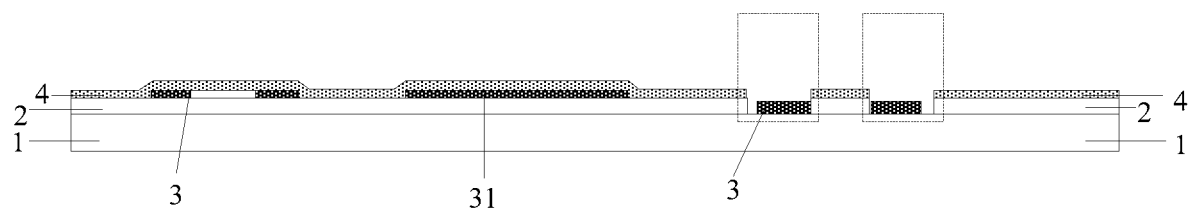
FIG. 21 is a structural schematic diagram of a display panel after a gate insulating layer is formed provided in an embodiment of the disclosure.
Figure 22:
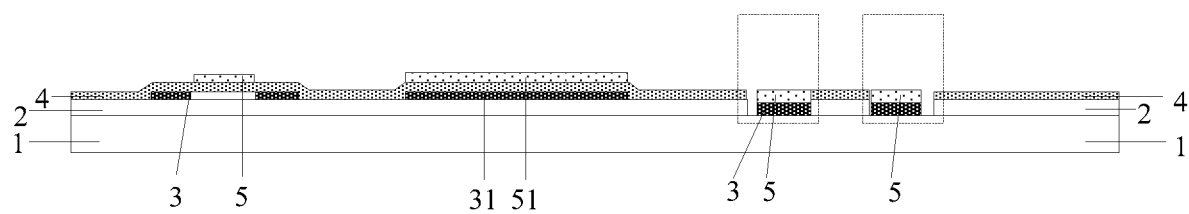
FIG. 22 is a structural schematic diagram of a display panel after a gate layer is formed provided in an embodiment of the disclosure.
Figure 23:
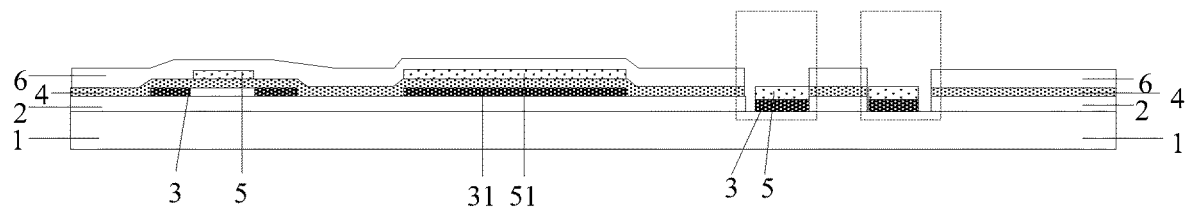
FIG. 23 is a structural schematic diagram of a display panel after an interlayer insulating layer is formed provided in an embodiment of the disclosure.
Figure 24:
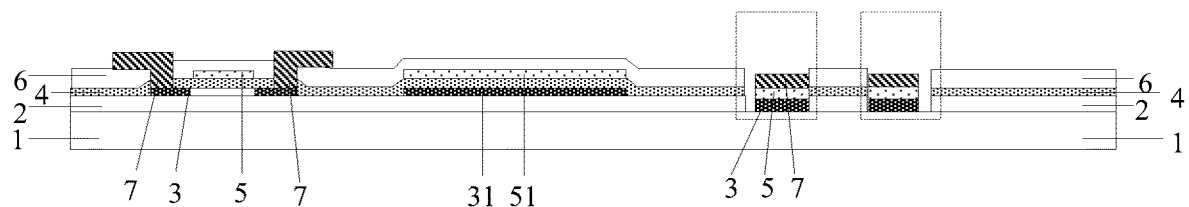
FIG. 24 is a structural schematic diagram of a display panel after a source/drain layer is formed provided in an embodiment of the disclosure.
Figure 25:
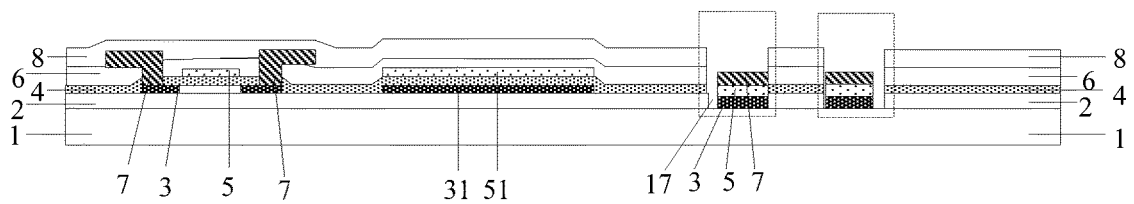
FIG. 25 is a structural schematic diagram of a display panel after a passivation layer is formed provided in an embodiment of the disclosure.
Figure 26:
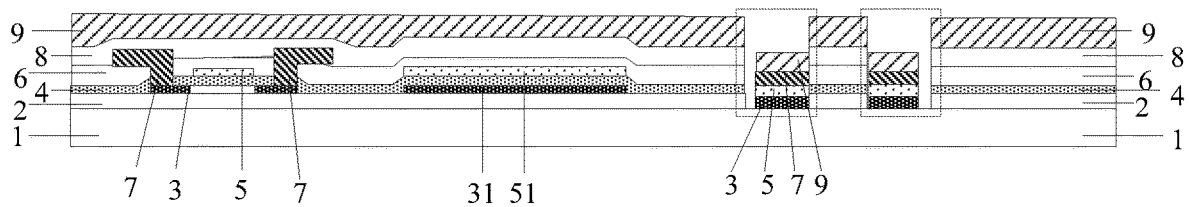
FIG. 26 is a structural schematic diagram of a display panel after a planarization layer is formed provided in an embodiment of the disclosure.
Figure 27:
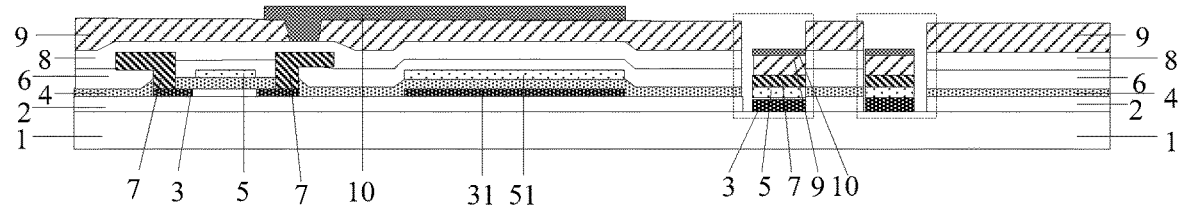
FIG. 27 is a structural schematic diagram of a display panel after an anode layer is formed provided in an embodiment of the disclosure.
Figure 28:
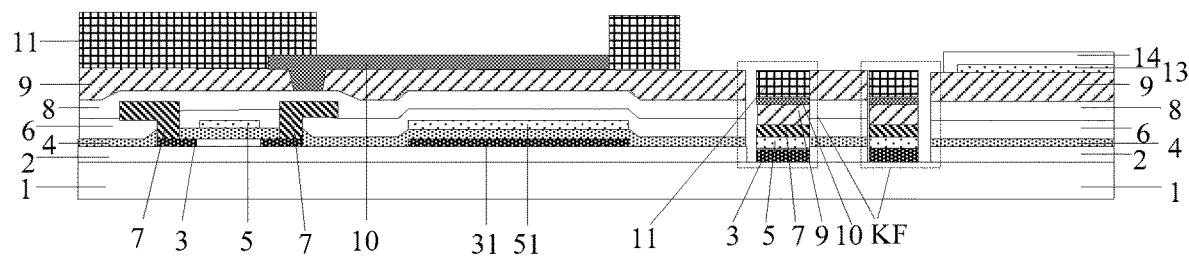
FIG. 28 is a structural schematic diagram of a display panel after a pixel defining layer is formed provided in an embodiment of the disclosure.
Figure 29:
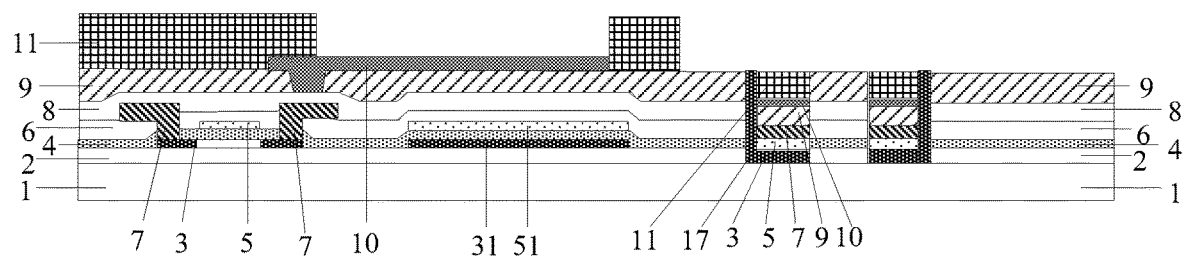
FIG. 29 is a structural schematic diagram of a display panel after a protective film layer is formed provided in an embodiment of the disclosure.
Figure 30:
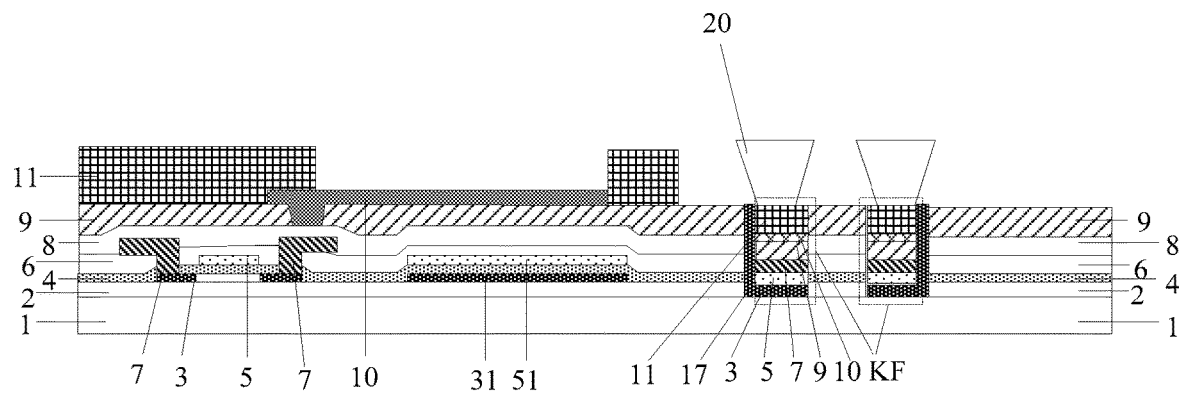
FIG. 30 is a structural schematic diagram of a display panel after a blocking layer is formed provided in an embodiment of the disclosure.
Figure 31:
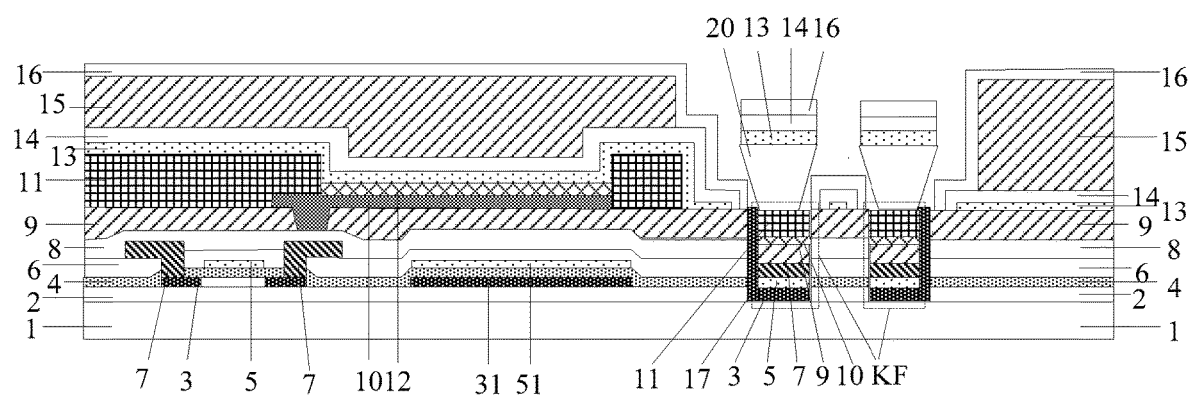
FIG. 31 is a structural schematic diagram of a display panel after a second inorganic encapsulation layer is formed provided in an embodiment of the disclosure.
Figure 32:
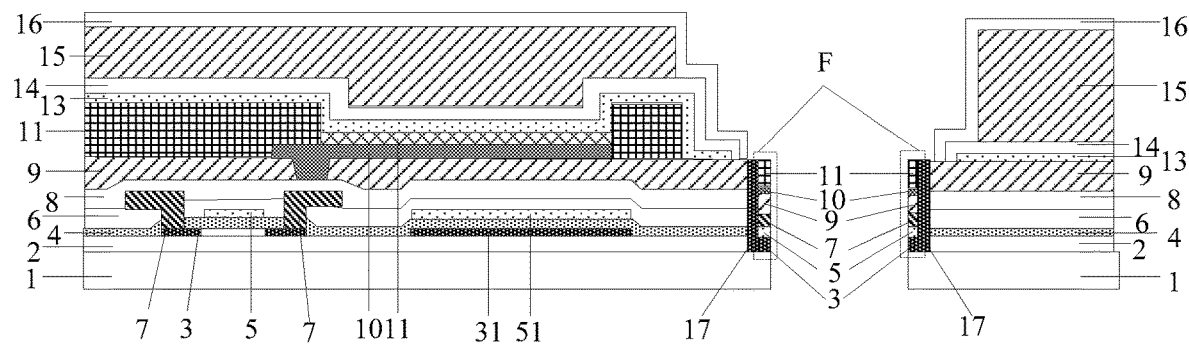
FIG. 32 is a structural schematic diagram of a display panel after punching provided in an embodiment of the disclosure.

To more clearly understand the structure of the display panel provided in an embodiment of the disclosure, a further detailed description is given below on the manufacturing method of the display panel provided in some embodiments of the disclosure referring to FIG. 19 to FIG. 32 based on the display panel shown in FIG. 5:

- forming a buffer layer 2 on the substrate 1, and removing the film, at the position (the dashed box position in FIG. 19) of the cutting damage prevention structure, of the buffer layer 2, as shown in FIG. 19;
- forming an active layer 3 on the buffer layer, patterning the active layer 3, and reserving the film, at the position of the cutting damage prevention structure, of the active layer 3, where a first electrode 31 of a capacitor can be formed in the active layer (in some embodiments by an ion implantation process to reduce the resistance of the active layer in the part), and the capacitor can be subsequently taken as a capacitor in a pixel circuit, as shown in FIG. 20;
- forming a gate insulating layer 4 on the active layer, and removing the film, at the position of the cutting damage prevention structure, of the gate insulating layer 4, as shown in FIG. 21;
- forming a gate layer 5 on the gate insulating layer 4, patterning the gate layer 5, and reserving the film of the gate layer 5 at the position of the cutting damage prevention structure, and also forming a second electrode 51 of the capacitor in the gate layer, as shown in FIG. 22;
- forming an interlayer insulating layer 6 on the gate layer 5, and removing the film of the interlayer insulating layer 6 at the position of the cutting damage prevention structure, as shown in FIG. 23;
- forming a source/drain layer 7 on the interlayer insulating layer 6, patterning the source/drain layer 7, and reserving the film of the source/drain layer 7 at the position of the cutting damage prevention structure, as shown in FIG. 24;
- forming a passivation layer 8 on the source/drain layer 7, and removing the film of the passivation layer 8 at the position of the cutting damage prevention structure, as shown in FIG. 25;
- forming a planarization layer 9 on the passivation layer 8 in sequence, patterning the planarization layer 9, and reserving the film of the planarization layer 9 at the position of the cutting damage prevention structure, as shown in FIG. 26;
- forming an anode layer 10 on the planarization layer 9, patterning the anode layer 10, and reserving the film of the anode layer 10 at the position of the cutting damage prevention structure, as shown in FIG. 27;
- forming a pixel defining layer 11 on the anode layer 10, patterning the pixel defining layer 11, reserving the film of the pixel defining layer at the position of the cutting damage prevention structure, and forming a cutting damage prevention structure KF, as shown in FIG. 28;
- forming a protective film layer 17 on an outer side wall of the cutting damage prevention structure KF through a composition process, as shown in FIG. 29. It should be noted that, if a display panel needs to be manufactured with a protective film layer 17, then in the above steps, a slot can be reserved on the outer side wall of the cutting damage prevention structure KF for the protective film layer 17. If a protective film layer 17 is not required, then no slot needs to be reserved;
- forming a blocking layer 20 with section shaped as an inverted-trapezoid at the position of the cutting damage prevention structure KF, as shown in FIG. 30;
- forming an organic light-emitting layer 12, a cathode layer 13, a first inorganic encapsulation layer 14, an organic encapsulation layer 15 (with the part, on the blocking layer 20, of the organic encapsulation layer 15 being removed), and the second inorganic encapsulation layer 16 in sequence on a side, facing away from the anode layer 10, of the pixel defining layer 11, where the cathode layer 13, the first inorganic encapsulation layer 14 and the second inorganic encapsulation layer 16 are all disconnected at the position of the blocking layer 20, as shown in FIG. 31; and
- cutting the cutting damage prevention structure KF, to remove the to-be-cut structure in the cutting damage prevention structure KF and form a via hole, and to form a protective barrier F covering a side wall of the via hole, as shown in FIG. 32.

Figure 33:
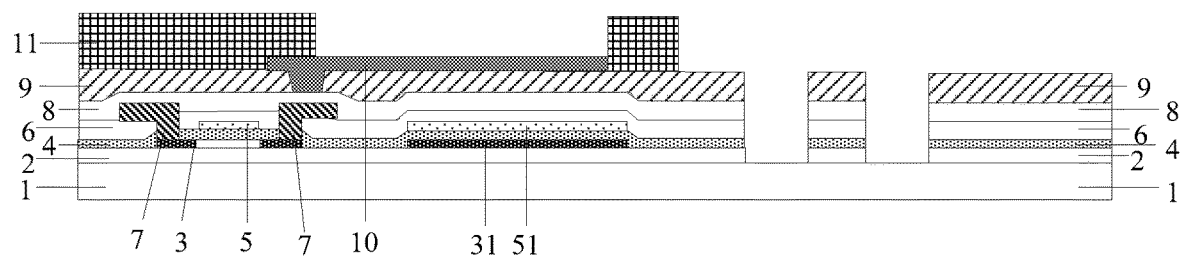
FIG. 33 is a structural schematic diagram of the display panel corresponding to FIG. 6 after the pixel defining layer is manufactured.
Figure 34:
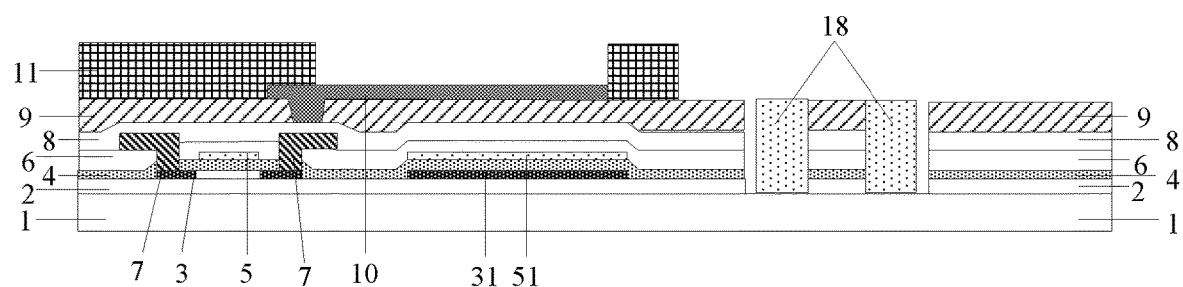
FIG. 34 is a structural schematic diagram of the display panel corresponding to FIG. 6 after the first film layer is manufactured.

As to the manufacturing of the display panel shown in FIG. 6, each film layer in the backplane film layer can be formed in sequence on the substrate; and when each film layer in the backplane film layer is patterned, the film of each film layer in the position of the cutting damage prevention structure is removed, to form a cutting slot at the position of the cutting damage prevention structure, and the cutting slot exposes the substrate, as shown in FIG. 33. The cutting slot is filled with the first film material, to form the cutting damage prevention structure, as shown in FIG. 34, and other manufacturing processes are similar to the process corresponding to FIG. 5, and will not be repeated redundantly herein.

Evidently those skilled in the art can make various modifications and variations to the embodiments of the disclosure without departing from the spirit and scope of the disclosure. Therefore, the disclosure is also intended to encompass these modifications and variations thereto so long as the modifications and variations made to the disclosure come into the scope of the claims appended to the disclosure and their equivalents.

What is claimed is:

1. A display panel, comprising:
a substrate, comprising a display area;
a backplane film layer, on a side of the substrate and in the display area;
a via hole, in the display area and completely running through the display panel along a thickness direction of the display panel; and
a protective barrier, in the via hole and covering an end side of the backplane film layer exposed by the via hole;
wherein the protective barrier and the backplane film layer are non-integrated structures; and
wherein a shape of an orthographic projection of the via hole on the substrate is a circle, a shape of an orthographic projection of the protective barrier on the substrate is a closed ring, the orthographic projection of protective barrier is located within the orthographic projection of the via hole, and an edge of the orthographic projection of the via hole coincides with an outer edge of the orthographic projection of protective barrier;

wherein the backplane film layer further comprises a buffer layer, an active layer, a gate insulating layer, a gate layer, an interlayer insulating layer, a source/drain layer, a passivation layer, a planarization layer, an anode layer and a pixel defining layer on the substrate in that order; wherein the buffer layer, the gate insulating layer, the interlayer insulating layer and the passivation layer are inorganic film layers; and wherein the display panel further comprises:
- a film layer of a light-emitting device disposed on a side, facing away from the substrate, of the backplane film layer; wherein the film layer of the light-emitting device is provided with a hollow area at a position of the via hole;
- an encapsulation layer arranged on a side, facing away from the substrate, of the film layer of the light-emitting device; wherein the encapsulation layer comprises: a first inorganic encapsulation layer, an organic encapsulation layer and a second inorganic encapsulation layer arranged on the substrate in sequence along a direction of ascending distance from the substrate; wherein the second inorganic encapsulation layer is provided with an inclined part, wherein the inclined part extends towards the backplane film layer on a side facing towards the via hole; and a section of the inclined part is step-like and covers in sequence a side wall of the organic encapsulation layer, a side wall of the first inorganic encapsulation layer and part of the backplane film layer; and
- an encapsulating protective barrier arranged on a side, facing away from the substrate, of the protective barrier, wherein the encapsulating protective barrier covers the inclined part and is in contact with the inclined part.

2. The display panel of claim 1, further comprising:
a protective film layer, between the end side of the backplane film layer and the protective barrier.

3. The display panel of claim 1, wherein the protective barrier comprises at least one layer of film layer structure, and the at least one layer of film layer structure is selected from at least one of the active layer, the gate layer, the source/drain layer, the planarization layer, the anode layer and the pixel defining layer; or,
wherein the protective barrier is a single-layer film structure, and a material of the single-layer film is metal or organic material.

4. The display panel of claim 2, wherein a material of the protective film layer is metal.

5. The display panel of claim 1, wherein an orthographic projection of the encapsulating protective barrier on the substrate is a closed ring, and surrounds an orthographic projection of the protective barrier on the substrate.

6. The display panel of claim 1, wherein the encapsulating protective barrier comprises an acrylic-based resin or a fluoride.

7. A display panel, comprising:
a substrate, comprising a display area;
wherein the display area comprises:
a to-be-punched area in the display area;
a reserved area, wherein area in the display area other than the to-be-punched area is the reserved area;
a backplane film layer in the reserved area; and
a cutting damage prevention structure in the to-be-punched area, wherein the cutting damage prevention structure comprises a to-be-cut structure and a protective barrier enclosing the to-be-cut structure, wherein the cutting damage prevention structure is independent of the backplane film layer;

wherein a shape of an orthographic projection of the to-be-cut structure on the substrate is a circle, a shape of an orthographic projection of the protective barrier on the substrate is a closed ring, and an edge of the orthographic projection of the to-be-cut structure coincides with an inner edge of the orthographic projection of protective barrier; and wherein the display panel comprises an organic light-emitting layer, a cathode layer, a first inorganic encapsulation layer, an organic encapsulation layer and a second inorganic encapsulation layer which are disposed in sequence on a side, facing away from the substrate, of the backplane film layer; wherein:
the organic light-emitting layer, the cathode layer, the first inorganic encapsulation layer, the organic encapsulation layer and the second inorganic encapsulation layer each is provided with a hollow area in the to-be-punched area;
the second inorganic encapsulation layer is provided with an inclined part which extends towards the backplane film layer on a side facing towards the via hole, and the section of the inclined part is step-like and covers in sequence a side wall of the organic encapsulation layer, a side wall of the first inorganic encapsulation layer and part of the backplane film layer; and
an annular encapsulating blocking structure is disposed on a side, facing away from the substrate, of the cutting damage prevention structure, and a gap is formed between the annular encapsulating blocking structure and the inclined part.

8. The display panel of claim 7, wherein the to-be-cut structure and the protective barrier are an integral structure before punching.

9. The display panel of claim 7, wherein an orthographic projection of the cutting damage prevention structure on the substrate is a circle, an oval, a rectangle, a triangle or a trapezoid.

10. The display panel of claim 7, wherein the display panel further comprises: an encapsulating protection structure filled in the gap.

11. The display panel of claim 10, wherein the encapsulating protection structure comprises an annular groove on a side of the encapsulating protection structure facing away from the backplane film layer, wherein
depth of the annular groove extends towards the encapsulating blocking structure; and
the annular groove exposes part of the encapsulating blocking structure.

12. The display panel of claim 10, wherein the encapsulating protection structure comprises a circular notch on a side of the encapsulating protection structure facing away from the backplane film layer, wherein
depth of the circular notch extends towards the encapsulating blocking structure; and the circular notch exposes part of the encapsulating blocking structure.

* * * * *